United States Patent
Alofs

(10) Patent No.: US 6,593,777 B2
(45) Date of Patent: Jul. 15, 2003

(54) MULTIPLEXED FLIP-FLOP ELECTRONIC DEVICE

(75) Inventor: Thomas Alofs, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/141,621

(22) Filed: May 8, 2002

(65) Prior Publication Data

US 2002/0167973 A1 Nov. 14, 2002

(30) Foreign Application Priority Data

May 9, 2001 (FR) ............................................. 01 06139

(51) Int. Cl.$^7$ .......................................... H03K 19/082
(52) U.S. Cl. .......................... 326/105; 326/93; 326/113
(58) Field of Search ........................... 326/93, 105, 112, 326/113, 37, 38, 47, 48, 49, 50

(56) References Cited

U.S. PATENT DOCUMENTS

| | | | |
|---|---|---|---|
| 5,173,626 A | 12/1992 | Kudou et al. ................ | 307/481 |
| 5,570,051 A | * 10/1996 | Chiang et al. ............... | 327/203 |
| 5,815,024 A | 9/1998 | Reddy et al. ................ | 327/408 |
| 6,285,226 B1 | * 9/2001 | Nguyen ....................... | 327/175 |
| 6,356,111 B1 | * 3/2002 | Moss .......................... | 326/41 |
| 6,456,113 B2 | * 9/2002 | Kanba ........................ | 326/93 |

OTHER PUBLICATIONS

Akita et al., A Selector–Merged Flip–Flop, Extended Abstracts of the International Conference on Solid State Devices and Materials, Japan Society of Applied Physics, Tokyo, Japan, 1999, pp. 268–269.

* cited by examiner

*Primary Examiner*—Don Le
(74) *Attorney, Agent, or Firm*—Lisa K. Jorgenson; Allen, Dyer, Doppelt, Milbrath & Gilchrist, P.A.

(57) ABSTRACT

A multiplexed flip-flop electronic device includes a decoder logic circuit for providing a first switching signal, and a control circuit for receiving a clock signal and for providing a gated clock signal forming a second switching signal. The electronic device further includes a multiplexing circuit having N inputs and an output, and a flip flop circuit. The flip-flop circuit includes a first switching stage connected between the N inputs and the output of the multiplexing circuit, and includes N switches being individually controlled by the first switching signal. A first buffer stage is connected to the output of the multiplexing circuit, and a second switching stage is connected to an output of the first buffer stage. The second switching stage is controlled by the second switching signal. A second buffer stage is connected to an output of the second switching stage.

26 Claims, 2 Drawing Sheets

US 6,593,777 B2

MULTIPLEXED FLIP-FLOP ELECTRONIC DEVICE

FIELD OF THE INVENTION

The present invention relates to integrated circuits, and more particularly, to a multiplexed flip-flop electronic device.

1. Background of the Invention

Multiplexed flip-flop devices are used in microprocessors as data path structures, for example. A multiplexed flip-flop device usually includes multiple input multiplexing means followed by a flip-flop. These two components are independent components obtained from standard component libraries. This yields a structure having a non-negligible overall surface area, relatively long signal propagation times, and high energy consumption.

2. Summary of the Invention

In view of the foregoing background, it is therefore an object of the present invention to provide a multiplexed flip-flop electronic device that includes components common to the multiplexing means and to the flip-flop, thus reducing the surface area of a corresponding integrated circuit cell.

Another object of the present invention is to use a gated clock signal to control the slave switch of the flip-flop, thus avoiding oscillation of certain nodes of the circuit, and consequently, this represents a saving in terms of energy consumption.

A further object of the present invention is to combine the means for generating the gated clock signal with the decoder logic circuit of the multiplexing means.

The invention not only economizes on overall surface area and energy consumption, but also reduces the propagation time of signals within the device, especially on the data paths and on the data input selection paths.

These and other objects, advantages and features according to the present invention are provided by a multiplexed flip-flop electronic device including multiplexing means with N inputs and one output. The multiplexing means is controlled by a decoder logic circuit, and includes the first switching stage of a flip-flop. The first switching stage is controlled by a first switching signal. The multiplexing means precedes two buffer stages which are also part of the flip-flop. Each buffer stage may be formed by two inverters connected in parallel to each other. The two buffer stages are separated by a second switching stage of the flip-flop. The second switching stage is controlled by a second switching signal.

According to one general feature of the invention, the multiplexing means include N switches that can be controlled individually, and also form the first switching stage (master switch). The decoder logic circuit delivers the first switching signal. The electronic device also includes control means receiving a clock signal, and delivers a gated clock signal forming the second switching signal.

Thus, in accordance with the invention, the first switching stage acting as the master switch of the flip-flop is also part of the multiplexing means. Furthermore, the gated clock signal that controls the second switching stage (slave switch) of the flip-flop avoids toggling of the nodes of the second switching stage. Consequently, this absence of toggling reduces energy consumption. Such toggling occurred in the prior art because the slave switch was controlled directly by the clock signal.

In one embodiment of the invention, the control means include a latch having an enable input for receiving an enable signal, a control input for receiving the inverted clock signal, and an enable output. The control means further include an AND gate having a first input connected to the enable output, a second input receiving the clock signal, and an output delivering the gated clock signal, i.e., the second switching signal.

The decoder circuit has a first control input receiving the inverted clock signal, and a second control input connected to the enable output of the latch. In other words, the first switching signal is also conditioned by the gated clock signal.

In one embodiment of the invention, the decoder circuit includes n decoder inputs, with N being equal to $2^n$, and N decoder AND gates. Each decoder AND gate has a first input forming the first control input, a second input forming the second control input, and n supplementary inputs connected to the n decoder inputs.

BRIEF DESCRIPTION OF THE DRAWINGS

Other advantages and features of the invention will become apparent on examining the detailed description of one non-limiting embodiment and the accompanying drawings, in which.

DETAILED DESCRIPTION OF THE PREFERRED EMBODIMENTS

Figure 1:
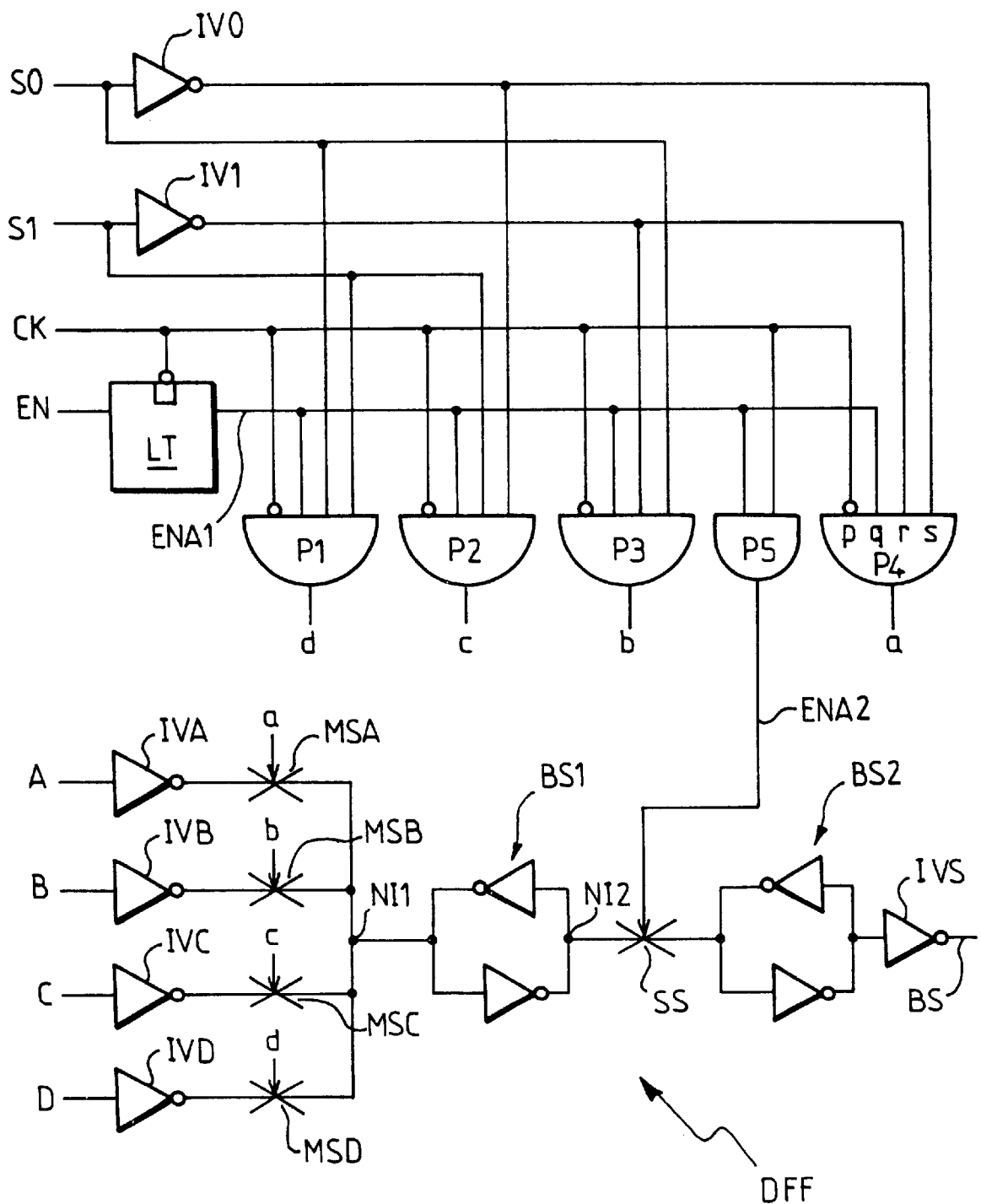
FIG. 1 shows diagrammatically the internal architecture of a multiplexed flip-flop electronic device according to the present invention.

FIG. 1 shows the four inputs A, B, C and D of a multiplexed flip-flop electronic device DFF in accordance with the invention. The four inputs conventionally include four inverters IVA, IVB, IVC and IVD. The respective inverters IVA-IVD are connected to the inputs of four switches MSA-MSD, each of which can take the form of a pair of complementary transistors, for example.

Each switch is controlled by a first switching signal. If the switches take the form of a pair of complementary transistors, the switching signal acts on the control gates of the two complementary transistors. To be more precise, the switch MSA is controlled by the switching signal a, the switch MSB is controlled by the switching signal b, the switch MSC is controlled by the switching signal c and the switch MSD is controlled by the switching signal d.

The four switches MSA–MSD form the first switching stage (master switch) of the flip-flop of the device. They also form multiplexing means for selecting one of the four inputs A, B, C, D on command. The output node NI1 common to the four switches MSA–MSD is connected to the remainder of the components of the flip-flop. To be more precise, the latter includes a first buffer stage BS1 defined by parallel connected inverters. The flip-flop includes a second buffer stage BS2 also defined by two parallel connected inverters.

The two buffer stages BS1 and BS2 are connected to each other by a second switching stage (slave switch) SS formed by a single switch. The switch is controlled by a second switching signal ENA2, whose source is described in more detail below. The switch may also be formed of two complementary transistors, for example.

To preserve the parity of the logic signals, an inverter IVS is disposed at the output BS of the flip-flop. This is because of the inverters IVA-IVD at the inputs of the electronic device.

The top part of FIG. 1 shows the decoder logic circuit of the multiplexer and control means that deliver a gated clock signal forming the second switching signal ENA2 and conditioning the first switching signals a, b, c, d. To be more precise, the control means include a conventional latch LT, as known in the art, having an enable input for receiving an enable signal EN, a control input for receiving the inverted clock signal CK, and an output delivering a signal ENA1. The latch LT is transparent when the clock signal is at a logic 0 and is active when the clock signal is at a logic 1, i.e., when the inverted clock signal is at a logic 0.

The control means include, in addition to the latch LT, an AND gate P5 having an input connected to the enable output of the latch and another input receiving the clock signal. The output of the AND gate P5 delivers the second switching signal ENA2. The decoder logic circuit includes four AND gates P1, P2, P3, P4 respectively delivering the first switching signals d, c, b and a.

As a function of the logic value 0 or 1 of the two selector signals S0 and S1 present at the two selector inputs S0 and S1 of the decoder circuit, only one of the four switching signals a to d will be active to turn on the corresponding master switch and deliver to the node NI1 the data bit present at the corresponding input. To be more precise, if the four inputs of each of the gates P1 to P4 are labeled p, q, r and s, the inputs p and q form two control inputs for the gates concerned. A first control input p receives the inverted clock signal CK, and a second control input q receives the signal ENA1 from the enable output of the latch LT.

In fact, as explained in detail below, the inverted clock signal reaching the first control input p of a logic gate Pi enables the selection of the path when the clock signal CK is at a logic 0, i.e., before the end of the cycle and before it returns to a logic 1. The signal ENA1 avoids oscillation at the nodes a, b, c and d when the clock signal CK and the enable signal EN are at a logic 0. This therefore minimizes energy consumption.

The supplementary inputs r and s of each of the logic gates Pi are used by the decoder logic circuit itself. To be more precise, the input r of the gate P1 is connected to the selector input S0, and the supplementary input s of the gate P1 is connected to the selector input S1.

The input r of the gate P2 is also connected to the selector input S1, and the input s of the gate P2 is connected to the input S0 via an inverter IV0. The input r of the gate P3 is connected to the input S1 via an inverter IV1, and the input s of the gate P3 is connected directly to the input S0. The input r of the gate P4 is connected to the input S1 via the inverter IV1, and the input s of the gate P4 is connected to the input S0 via the inverter IV0.

Thus, for example, a logic 0 at the input S0 and a logic 0 at the input S1 set the signal a to a logic 1 when the clock signal CK is at a logic 0 and when the enable signal EN goes to a logic 1. Consequently, the data bit present at the input A to the first buffer stage BS1 of the flip-flop is delivered.

Figure 2:
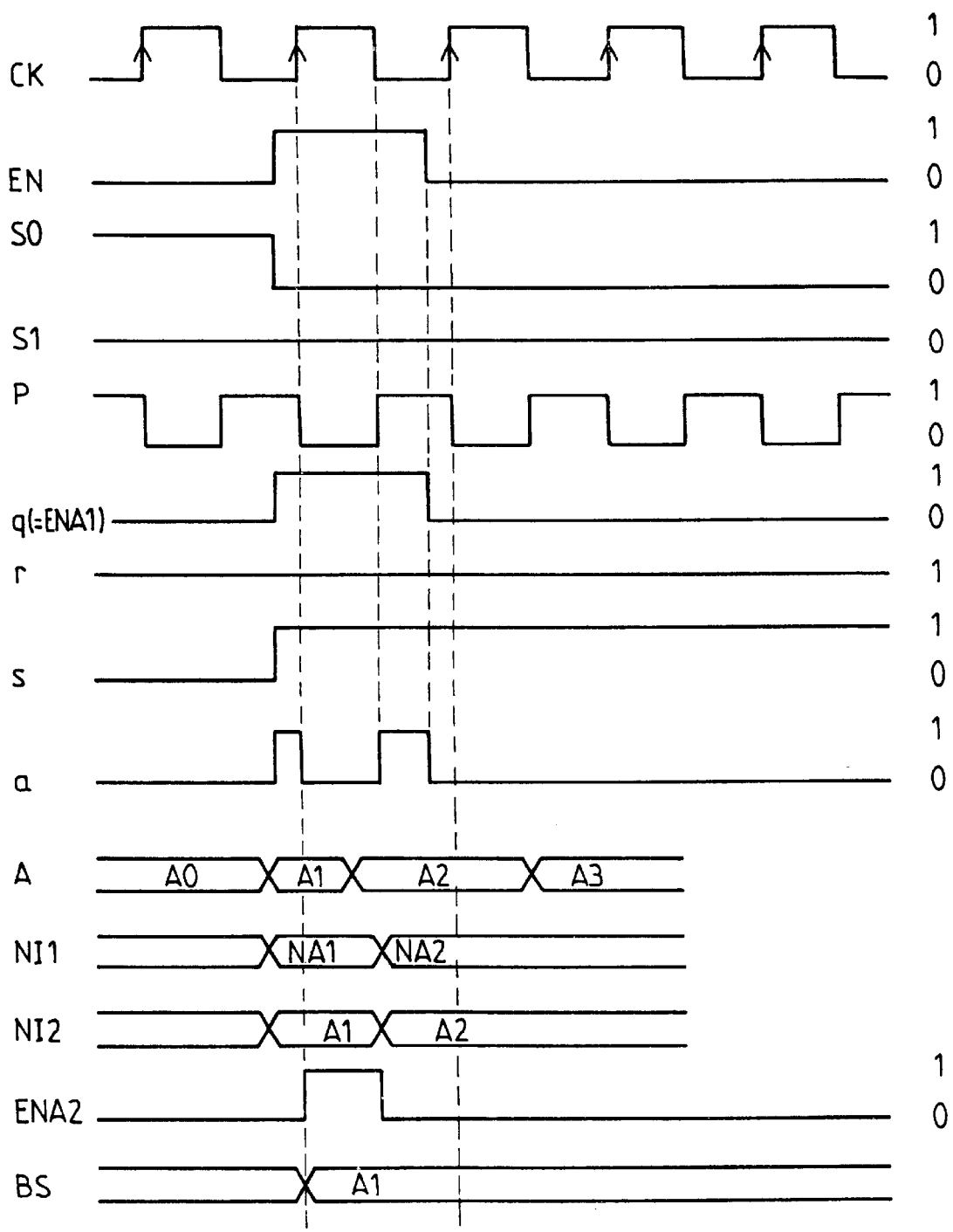
FIG. 2 shows timing diagrams illustrating operation of one particular example of the device shown in FIG. 1.

An embodiment of the above kind will now be described in more detail with more particular reference to FIG. 2. The clock signal CK is represented at the top of FIG. 2. Just before the end of a clock signal cycle, i.e., just before the clock signal CK returns to a logic 1, the enable signal EN is activated (set to a logic 1). The signals S0 and S1 are set to a logic 0.

Because the signals r and s of the gate P4 are inverted relative to the signals S0 and S1, they take the value 1. The signal present at the input p of the gate P4 is the inverted clock signal. As a result of this the signal present at the input q of the gate P4, i.e., the signal ENA1, takes a logic 1 when the enable signal EN goes to a logic 1 and remains at 1 until the enable signal EN returns to a logic 0, which occurs just before the end of the next clock cycle.

Consequently, when the enable signal EN goes to a logic 1, the four inputs of the logic state P4 are at a logic 1, which causes the switching signal a to go to 1. The signal a remains at a logic 1 until the rising edge of the clock signal CK. This enables the selection of the input A for as long as the clock signal CK is at a logic 0. Of course, the person skilled in the art will know how to choose the characteristics of the various logic components used so that the propagation time of the signals actually causes the switching signal a to go to a logic 1 before the rising edge of the clock signal CK.

Assume now that a data bit A1 was present at the input A when the switching signal a went to a logic 1. As a result of this the data bit A1 is stored in the buffer stage BS1. The complemented data bit NA1 is available at the node NI2. When the second switching signal ENA2 goes to a logic 1 on the rising edge of the clock signal CK, the data bit A1 is then available at the output BS of the flip-flop.

It can therefore be seen that the device has selected an input of the multiplexer before the rising edge of the clock signal has enabled the selected input, and has then delivered to the output of the flip-flop the data bit present at the selected input of the multiplexer at the time of the rising edge of the clock signal CK.

It should be noted here that the invention also does away with a loopback multiplexer for the memory flip-flop. If a data bit is to be retained in the flip-flop in time with the clock edges of the signal CK, it is sufficient to maintain the enable signal EN at a logic 0.

That which is claimed is:

1. A multiplexed flip-flop electronic device comprising:
    a decoder logic circuit for providing at least one first switching signal;
    a control circuit for receiving a clock signal and for providing a second switching signal;
    a multiplexing circuit having N inputs and an output; and
    a flip flop circuit comprising
        a first switching stage connected between the N inputs and the output of said multiplexing circuit, and comprising N switches being individually controlled by the at least one first switching signal,
        a first buffer stage connected to the output of said multiplexing circuit,
        a second switching stage connected to an output of said first buffer stage, and being controlled by the second switching signal, and
        a second buffer stage connected to an output of said second switching stage.

2. A multiplexed flip-flop electronic device according to claim 1, wherein the second switching signal is a gated clock signal.

3. A multiplexed flip-flop electronic device according to claim 1, wherein said control circuit comprises:
    a latch having an enable input for receiving an enable signal, a control input for receiving an inverted clock signal, and an enable output; and
    an AND gate having a first input connected to the enable output, a second input for receiving the clock signal, and an output for providing the second switching signal.

4. A multiplexed flip-flop electronic device according to claim 3, wherein said decoder logic circuit has a first control input for receiving the inverted clock signal, and a second control input connected to the enable output of said latch.

5. A multiplexed flip-flop electronic device according to claim 4, wherein said decoder logic circuit comprises:
   n decoder inputs; and
   N decoder AND gates for providing the at least one first switching signal, with N being equal to $2^n$ and with each AND gate having a first input forming the first control input, a second input forming the second control input, and n supplementary inputs connected to the n decoder inputs.

6. A multiplexed flip-flop electronic device according to claim 4, wherein said first and second buffer stages each comprises a pair of parallel connected inverters.

7. An electronic device comprising:
   a decoder logic circuit for providing N first switching signals;
   a control circuit for providing a second switching signal;
   a multiplexing circuit having N inputs and an output; and
   a flip flop circuit comprising
      a first switching stage connected between the N inputs and the output of said multiplexing circuit, and being controlled by the N first switching signals,
      a first buffer stage connected to the output of said multiplexing circuit,
      a second switching stage connected to an output of said first buffer stage, and being controlled by the second switching signal, and
      a second buffer stage connected to an output of said second switching stage.

8. An electronic device according to claim 7, wherein said first switching stage comprises N switches being individually controlled by the respective N first switching signals.

9. An electronic device according to claim 7, wherein said control circuit has an input for receiving a clock signal; and wherein the second clock signal is a gated clock signal.

10. An electronic device according to claim 7, wherein said control circuit comprises:
    a latch having an enable input for receiving an enable signal, a control input for receiving an inverted clock signal, and an enable output; and
    an AND gate having a first input connected to the enable output, a second input for receiving a clock signal, and an output for providing the second switching signal.

11. An electronic device according to claim 10, wherein said decoder logic circuit has a first control input for receiving the inverted clock signal, and a second control input connected to the enable output of said latch.

12. An electronic device according to claim 11, wherein said decoder logic circuit comprises:
    n decoder inputs; and
    N decoder AND gates for providing the N first switching signals, with N being equal to $2^n$ and with each AND gate having a first input forming the first control input, a second input forming the second control input, and n supplementary inputs connected to the n decoder inputs.

13. An electronic device according to claim 7, wherein said first and second buffer stages each comprises a pair of parallel connected inverters.

14. An electronic device comprising:
    a decoder logic circuit comprising
       n decoder inputs, and
       N decoder logic gates for providing N first switching signals, with N being equal to $2^n$ and with each logic gate having a first control input, a second control input, and n supplementary inputs connected to the n decoder inputs;
    a multiplexing circuit having N inputs and an output; and
    a flip flop circuit comprising
       a first switching stage connected between the N inputs and the output of said multiplexing circuit, and comprising N switches being individually controlled by the respective N first switching signals,
       a first buffer stage connected to the output of said multiplexing circuit,
       a second switching stage connected to an output of said first buffer stage, and being controlled by the second switching signal, and
       a second buffer stage connected to an output of said second switching stage.

15. An electronic device according to claim 14, wherein each decoder logic gate comprises an AND gate.

16. An electronic device according to claim 14, further comprising a control circuit for receiving a clock signal and for providing the second switching signal.

17. An electronic device according to claim 16, wherein the second switching signal is a gated clock signal.

18. An electronic device according to claim 16, wherein said control circuit comprises:
    a latch having an enable input for receiving an enable signal, a control input for receiving an inverted clock signal, and an enable output; and
    an AND gate having a first input connected to the enable output, a second input for receiving the clock signal, and an output for providing the second switching signal.

19. An electronic device according to claim 18, wherein said decoder logic circuit has a first control input for receiving the inverted clock signal, and a second control input connected to the enable output of said latch.

20. An electronic device according to claim 14, wherein said first and second buffer stages each comprises a pair of parallel connected inverters.

21. A method for forming a multiplexed flip-flop electronic device comprising:
    forming a decoder logic circuit for providing N first switching signals;
    forming a control circuit for providing a second switching signal;
    forming a multiplexing circuit having N inputs and an output; and
    forming a flip flop circuit comprising
       connecting a first switching stage between the N inputs and the output of the multiplexing circuit, the first switching stage being controlled by the N first switching signals,
       connecting a first buffer stage to the output of the multiplexing circuit,
       connecting a second switching stage to an output of the first buffer stage, the second switching stage being controlled by the second switching signal, and
       connecting a second buffer stage to an output of the second switching stage.

22. A method according to claim 21, wherein the first switching stage comprises N switches being individually controlled by the respective N first switching signals.

23. A method according to claim 21, wherein the control circuit has an input for receiving a clock signal; and wherein then second clock signal is a gated clock signal.

24. A method according to claim 21, wherein the control circuit comprises:

a latch having an enable input for receiving an enable signal, a control input for receiving an inverted clock signal, and an enable output; and an AND gate having a first input connected to the enable output, a second input for receiving a clock signal, and an output for providing the second switching signal.

25. A method according to claim 24, wherein the decoder logic circuit has a first control input for receiving the inverted clock signals, and a second control input connected to the enable output of the latch.

26. A method according to claim 25, wherein the decoder logic circuit comprises:

n decoder input;

N decoder AND gates for providing the N first switching signals, with N being equal to $2^n$ and with each AND gate having a first input forming the first control input, a second input forming the second control input, and n supplementary inputs connected to the n decoder inputs.

* * * * *